United States Patent
Sakamoto

(10) Patent No.: US 9,559,241 B2
(45) Date of Patent: Jan. 31, 2017

(54) PANEL, METHOD FOR PRODUCING PANEL, SOLAR CELL MODULE, PRINTING APPARATUS, AND PRINTING METHOD

(71) Applicant: TAKANOHA TRADING CO., LTD., Osaka (JP)

(72) Inventor: Koji Sakamoto, Osaka (JP)

(73) Assignee: TAKANOHA TRADING CO., LTD., Osaka (JP)

( * ) Notice: Subject to any disclaimer, the term of this patent is extended or adjusted under 35 U.S.C. 154(b) by 0 days.

(21) Appl. No.: 13/733,766

(22) Filed: Jan. 3, 2013

(65) Prior Publication Data

US 2013/0122645 A1     May 16, 2013

Related U.S. Application Data

(63) Continuation of application No. PCT/JP2011/065754, filed on Jul. 11, 2011.

(30) Foreign Application Priority Data

Jul. 9, 2010   (JP) ................. 2010-157344

(51) Int. Cl.
*H01L 31/18*     (2006.01)
*H01L 21/67*     (2006.01)
(Continued)

(52) U.S. Cl.
CPC .......... *H01L 31/18* (2013.01); *H01L 21/6715* (2013.01); *H01L 31/028* (2013.01); *H01L 31/022425* (2013.01); *Y02E 10/547* (2013.01)

(58) Field of Classification Search
None
See application file for complete search history.

(56) References Cited

U.S. PATENT DOCUMENTS

| 5,344,498 A | 9/1994 | Inoue |
| 5,401,336 A | 3/1995 | Noguchi et al. |

(Continued)

FOREIGN PATENT DOCUMENTS

| CN | 101651167 A | 2/2010 |
| EP | 2219226 A2 | 8/2010 |

(Continued)

OTHER PUBLICATIONS

An Office Action issued by Mexican Patent Office on Aug. 13, 2013, which corresponds to Mexican Patent Application No. MX/a/2013/000108 and is related to U.S. Appl. No. 13/733,766.

(Continued)

*Primary Examiner* — Julio J Maldonado
*Assistant Examiner* — Stanetta Isaac
(74) *Attorney, Agent, or Firm* — Studebaker & Brackett PC

(57) ABSTRACT

A printing apparatus according to the present invention includes a printing section configured to print ink on a surface of a substrate. The printing section prints conductive ink containing a conductive material by offset printing and prints conductive ink containing a conductive material different from the conductive material on the conductive ink by offset printing. Preferably, the printing apparatus further includes a conveyor configured to convey the substrate. Further, the printing section preferably includes a first printing machine configured to print first conductive ink and a second printing machine configured to print second conductive ink.

21 Claims, 16 Drawing Sheets

(51) Int. Cl.
*H01L 31/0224* (2006.01)
*H01L 31/028* (2006.01)

(56) References Cited

U.S. PATENT DOCUMENTS

| | | | |
|---|---|---|---|
| 5,527,717 | A | 6/1996 | Inoue |
| 6,184,964 | B1 | 2/2001 | Kameyama et al. |
| 6,207,268 | B1 * | 3/2001 | Kosaka .................. B41M 5/265 428/206 |
| 7,569,160 | B2 | 8/2009 | Oldenzijl et al. |
| 8,629,346 | B2 | 1/2014 | Matsui et al. |
| 2002/0084503 | A1 | 7/2002 | Lee et al. |
| 2004/0247797 | A1 * | 12/2004 | Hirai .................. H01J 9/02 427/534 |
| 2005/0284315 | A1 * | 12/2005 | Yu et al. .................. 101/154 |
| 2006/0162770 | A1 | 7/2006 | Matsui et al. |
| 2007/0152928 | A1 * | 7/2007 | Doane ............... G02F 1/133305 345/87 |
| 2008/0023069 | A1 * | 1/2008 | Terada et al. ................. 136/256 |
| 2008/0196757 | A1 | 8/2008 | Yoshimine |
| 2008/0250972 | A1 | 10/2008 | Oldenzijl |
| 2009/0061077 | A1 | 3/2009 | King et al. |
| 2010/0018562 | A1 * | 1/2010 | Kurahashi ......... H01L 31/02243 136/244 |
| 2010/0018577 | A1 | 1/2010 | Nishiwaki et al. |
| 2010/0084001 | A1 | 4/2010 | Tsunomura et al. |
| 2010/0132792 | A1 | 6/2010 | Kim et al. |
| 2010/0181670 | A1 | 7/2010 | Krause et al. |
| 2011/0030759 | A1 | 2/2011 | Funakoshi |
| 2011/0284050 | A1 * | 11/2011 | Saita et al. .................... 136/244 |
| 2012/0037219 | A1 * | 2/2012 | Kim et al. .................... 136/256 |
| 2012/0178195 | A1 * | 7/2012 | Ray et al. ........................ 438/29 |
| 2012/0231576 | A1 | 9/2012 | King et al. |

FOREIGN PATENT DOCUMENTS

| | | |
|---|---|---|
| EP | 2273558 A1 | 1/2011 |
| EP | 2375454 A1 | 10/2011 |
| JP | H03-227576 A | 10/1991 |
| JP | H04-312985 A | 11/1992 |
| JP | H05-102511 A | 4/1993 |
| JP | H07-131041 A | 5/1995 |
| JP | H07-335922 A | 12/1995 |
| JP | 2005-175449 A | 6/2005 |
| JP | 2007-44974 A | 2/2007 |
| JP | 2007-207957 A | 8/2007 |
| JP | 2008-168578 A | 7/2008 |
| JP | 2009-064855 A | 3/2009 |
| JP | 2009-194013 A | 8/2009 |
| JP | 2009-253096 A | 10/2009 |
| JP | 2010-34161 A | 2/2010 |
| JP | 2010-067987 A | 3/2010 |
| JP | 2010-090211 A | 4/2010 |
| JP | 2010-103347 A | 5/2010 |
| JP | 2010-147107 A | 7/2010 |
| JP | 2010-147194 A | 7/2010 |
| KR | 10-2010-0013196 A | 2/2010 |
| TW | 200423453 A | 11/2004 |
| TW | 200816502 A | 4/2008 |
| TW | 200909530 A | 3/2009 |
| TW | 200918325 A | 5/2009 |
| TW | M361106 U | 7/2009 |
| WO | 2009/006988 A1 | 1/2009 |

OTHER PUBLICATIONS

An Office Action issued by Taiwan Patent Office on Oct. 14, 2013, which corresponds to Taiwanese Patent Application No. 100124312 and is related to U.S. Appl. No. 13/733,766.
Japanese Office Action "Notification of Reasons for Rejection" dated Mar. 5, 2013, which corresponds to Japanese Patent Application No. 2012-523547 and is related to U.S. Appl. No. 13/733,766.
International Search Report; PCT/JP2011/065754; Oct. 18, 2011.
An Office Action issued by Taiwan Patent Office on Mar. 17, 2014, which corresponds to Taiwanese Patent Application No. 100124311 and is related to U.S. Appl. No. 13/733,766.
The extended European search report issued by the European Patent Office on May 9, 2014, which corresponds to EP11803705.0-1564 and is related to U.S. Appl. No. 13/733,766.
Communication Pursuant to Article 74(3) EPC issued by the European Patent Office on Aug. 6, 2014, which corresponds to EP11803705.0-1564 and is related to U.S. Appl. No. 13/733,766.
Communication pursuant to Article 94(3) EPC issued by the European Patent Office on Feb. 17, 2015, which corresponds to European Patent Application No. 11 803 705.0-1556 and is related to U.S. Appl. No. 13/733,766.
An Office Action issued by the Korean Patent Office on Sep. 26, 2014, which corresponds to Korean Patent Application 10-2013-7003111 and is related to U.S. Appl. No. 13/733,766.
An Office Action issued by the Mexican Patent on Aug. 28, 2014, which corresponds to Mexican Patent Application No. MX/E/2014-053523 and is related to U.S. Appl. No. 13/733,766.
An Office Action; "Notice of Reasons for Rejection," issued by the Japanese Patent Office on Jul. 14, 2015, which corresponds to Japanese Patent Application No. 2013-192437 and is related to U.S. Appl. No. 13/733,766.
An Office Action; "Notice of Reasons for Rejection," issued by the Japanese Patent Office on Nov. 4, 2015, which corresponds to Japanese Patent Application No. 2013-192437 and is related to U.S. Appl. No. 13/733,766.
An Office Action; "Notice of Reasons for Rejection," issued by the Japanese Patent Office on Oct. 25, 2016, which corresponds to Japanese Patent Application No. 2016-019709 and is related to U.S. Appl. No. 13/733,766.

* cited by examiner

PANEL, METHOD FOR PRODUCING PANEL, SOLAR CELL MODULE, PRINTING APPARATUS, AND PRINTING METHOD

CROSS-REFERENCE TO RELATED APPLICATIONS

The present application is a continuation of International Application No. PCT/JP2011/065754, filed Jul. 11, 2011, which claims priority to Japanese Patent Application No. 2010-157344, filed Jul. 9, 2010. The contents of these applications are incorporated herein by reference in their entirety.

TECHNICAL FIELD

The present invention relates to panels, methods for producing a panel, solar cell modules, printing apparatuses, and printing methods.

BACKGROUND ART

Solar panels can convert clean and inexhaustibly-supplied solar energy directly to electric energy and therefore are expected as novel energy sources. Silicon substrates are used for current mainstream solar panels. A collector electrode containing silver is provided on the surface of a silicon substrate. With the use of silver as a material for the collector electrode, it has been attempted to reduce the contact resistance between the silicon substrate and the collector electrode and to suppress the resistance of the collector electrode itself (for example, see Japanese Unexamined Patent Application Publication No. 2009-194013).

Further, a wide width of the collector electrode provided on a light receiving side of a solar panel reduces the opening area of the silicon substrate to achieve inefficient energy conversion. Accordingly, it has been proposed to form an electrode in which a conductive layer containing silver is layered to reduce the reduction in the opening area and reduce the resistances (for example, see Japanese Unexamined Patent Application Publication No. 2010-090211). JP No. 2010-090211 discloses that a conductive layer containing silver is layered by printing to reduce the specific resistance and suppress oxidation.

SUMMARY OF THE INVENTION

When a conductive layer is layered by printing as disclosed in JP No. 2010-090211, wasted conductive material can be reduced. However, further cost reduction is desired recently. For example, when a conductive layer containing a conductive material other than silver (e.g., comparatively inexpensive copper) is layered, although the resistance of the electrode itself can be reduced, the contact resistance to the silicon substrate increases, thereby obtaining insufficient features. As such, the printing method disclosed in Patent Literature 2 may not lead to formation of a desired electrode. Further, mere formation of an electrode may not achieve reduction in cost of the electrode material. In addition, oxidation of the electrode formed on the substrate may increase the resistivity.

The present invention has been made in view of the foregoing problems and has its object of providing a panel, a method for producing a panel, a solar cell module including a panel, a printing apparatus, and a printing method, in which the degree of freedom of electrode design is increased.

A printing apparatus according to the present invention is a printing apparatus including a printing section configured to print ink on a surface of a substrate. The printing section prints first conductive ink containing a first conductive material by offset printing, and prints second conductive ink containing a second conductive material different from the first conductive material on the first conductive ink by offset printing.

In one embodiment, the printing apparatus further includes a conveyor configured to convey the substrate.

In one embodiment, the printing section includes a first printing machine configured to print the first conductive ink and a second printing machine configured to print the second conductive ink.

In one embodiment, the first conductive material contains silver.

In one embodiment, the second conductive material contains any of copper, gold, carbon, cobalt, titanium, nickel, and aluminum, or at least two selected from the group consisting of silver, copper, gold, carbon, cobalt, titanium, nickel, and aluminum.

In one embodiment, the printing section prints anti-oxidation ink to cover at least part of the first conductive ink and the second conductive ink.

In one embodiment, the anti-oxidation ink contains a transparent material.

In one embodiment, the anti-oxidation ink contains a conductive material.

In one embodiment, the first conductive ink has a width larger than the second conductive ink as viewed in a normal direction of the surface of the substrate.

In one embodiment, the first conductive ink has a length larger than the second conductive ink.

A printing method according to the present invention is a printing method for printing ink on a surface of a substrate, including: printing first conductive ink containing a first conductive material by offset printing; and printing second conductive ink containing a second conductive material different from the first conductive material on the first conductive ink by offset printing.

A panel according to the present invention is a panel including a substrate having a surface and an electrode having a layered structure provided on the surface of the substrate. The layered structure includes a first conductive layer containing a first conductive material and a second conductive layer containing a second conductive material different from the first conductive material.

In one embodiment, the first conductive layer contains silver.

In one embodiment, the second conductive layer contains any of copper, gold, carbon, cobalt, titanium, nickel, and aluminum, or at least two selected from the group consisting of silver, copper, gold, carbon, cobalt, titanium, nickel, and aluminum.

In one embodiment, the first conductive layer and the second conductive layer are individually printed by offset printing.

A solar cell module according to the present invention includes a plurality of the above panels.

A method for producing a panel according to the present invention includes: preparing a substrate having a surface; and forming an electrode on the surface of the substrate. The forming an electrode includes: printing first conductive ink containing a first conductive material on the surface of the substrate by offset printing; printing second conductive ink containing a second conductive material different from the first conductive material on the first conductive ink by offset printing; and heating the first conductive ink and the second conductive ink.

A panel according to the present invention includes a substrate having a surface and an electrode having a layered structure provided on the surface of the substrate. The electrode includes a first linear electrode and a second linear electrode extending from the first electrode. The second linear electrode includes a sectional area decreasing part of which sectional area in a section orthogonal to a longitudinal direction of the second linear electrode decreases in a direction away from the first linear electrode.

In one embodiment, the number of layers of the layered structure at a part of the sectional area decreasing part which has the smallest sectional area is smaller than the number of layers of the layered structure at a part of the sectional area decreasing part which has the largest sectional area.

In one embodiment, in the sectional area decreasing part, the sectional area of the second linear electrode continuously varies along a direction away from the first linear electrode.

In one embodiment, in the sectional area decreasing part, the width of the second linear electrode continuously decreases in a direction away from the first linear electrode when the electrode is viewed in the normal direction of the surface of the substrate.

In one embodiment, the layered structure includes a first conductive layer and a second conductive layer partially layered on the first conductive layer.

In one embodiment, the width of the first conductive layer is larger than the width of the second conductive layer when the electrode is viewed in the normal direction of the surface of the substrate.

In one embodiment, the length of the first conductive layer in a direction away from the first linear electrode is larger than the length of the second conductive layer in the direction away from the first linear electrode.

In one embodiment, the first conductive layer contains a first conductive material, while the second conductive layer contains a second conductive material different from the first conducive material.

In one embodiment, the first conductive material contains silver.

In one embodiment, the second conductive material contains any of copper, gold, carbon, cobalt, titanium, nickel, and aluminum, or at least two selected from the group consisting of silver, copper, gold, carbon, cobalt, titanium, nickel, and aluminum.

In one embodiment, the panel further includes an anti-oxidation layer to prevent oxidation of at least part of the electrode.

In one embodiment, the anti-oxidation layer contains a transparent material.

In one embodiment, the anti-oxidation layer contains a conductive material.

In one embodiment, the first linear electrode includes a first parallel electrode and a second parallel electrode which extend in parallel to each other in a direction away from the first linear electrode. The second linear electrode includes a crossed electrode electrically connected to the first parallel electrode and the second parallel electrode. The crossed electrode includes a first sectional area decreasing part in contact with the first parallel electrode and a second sectional are decreasing part in contact with the second parallel electrode.

In one embodiment, when the electrode is viewed in the normal direction of the surface of the substrate, the sectional area of a central part of the crossed electrode between the first parallel electrode and the second parallel electrode is smaller than the sectional area of a part of the crossed electrode which is near the first parallel electrode and the sectional area of a part of the crossed electrode which is near the second parallel electrode.

In one embodiment, when the electrode is viewed in the normal direction of the surface of the substrate, the width of a central part of the crossed electrode between the first parallel electrode and the second parallel electrode is smaller than the width of a part of the crossed electrode which is near the first parallel electrode and the width of a part of the crossed electrode which is near the second parallel electrode.

A solar cell module according to the present invention includes a plurality of the above panels.

A printing apparatus according to the present invention includes a printing section configured to print ink on a surface of a substrate. The printing section is configured to print conductive ink including a first linear part having a layered structure linearly extending in a predetermined direction and a second linear part extending in a direction different from that of the first linear part so as to decrease a sectional area of a section orthogonal to the longitudinal direction of the second linear part in a direction away from the first linear part.

In one embodiment, the printing apparatus further includes a conveyor configured to convey the substrate.

In one embodiment, the printing section includes a first printing machine configured to pint first conductive ink and a second printing machine configured to print second conductive ink on the first conductive ink.

A printing method according to the present invention is a printing method for printing ink on a surface of a substrate. The printing method includes printing conductive ink including a first linear part having a layered structure linearly extending in a predetermined direction and a second linear part extending in a direction different from that of the first linear part so as to decrease a sectional area of a section orthogonal to a longitudinal direction of the second linear part in a direction away from the first linear part.

In one embodiment, the printing includes printing first conductive ink on the surface of the substrate, and printing on the first conductive ink second conductive ink having a width and a length at least one of which is smaller than that of the first conducive ink.

A method for producing a panel according to the present invention is a method for producing a panel including preparing a substrate having a surface, and forming an electrode on the surface of the substrate. The forming the electrode includes printing conductive ink including a first linear part having a layered structure linearly extending in a predetermined direction and a second linear part extending in a direction different from that of the first linear part so as to decrease a sectional area of a section orthogonal to a longitudinal direction of the second linear part in a direction away from the first linear part, and heating the conductive ink.

In one embodiment, the printing includes printing first conductive ink and printing on the first conductive ink second conductive ink having a width and a length at least one of which is smaller than that of the first conductive ink.

A panel according to the present invention includes a substrate having a surface, an electrode provided on the surface of the substrate, and an anti-oxidation layer to prevent oxidization of at least part of the electrode.

In one embodiment, the anti-oxidation layer contains a transparent material.

In one embodiment, the anti-oxidation layer contains a conductive material.

In one embodiment, the substrate includes a photoelectric conversion layer.

In one embodiment, the electrode has a layered structure.

In one embodiment, the layered structure includes a first conductive layer and a second conductive layer provided on the first conductive layer.

In one embodiment, the length of the first conductive layer in a predetermined direction is larger than the length of the second conductive layer in the predetermined direction.

In one embodiment, the width of the first conducive layer is larger than the width of the second conductive layer when the electrode is viewed in the normal direction of the surface of the substrate.

In one embodiment, the first conductive material contains a first conductive material, while the second conductive layer contains a second conductive material different from the first conductive material.

In one embodiment, the first conductive material contains silver.

In one embodiment, the second conductive material contains any of copper, gold, carbon, cobalt, titanium, nickel, and aluminum, or at least two selected from the group consisting of silver, copper, gold, carbon, cobalt, titanium, nickel, and aluminum.

In one embodiment, the electrode includes a plurality of parallel electrodes extending in parallel to each other, and the anti-oxidation layer is separated to individually cover the plurality of parallel electrodes.

In one embodiment, the width of the anti-oxidation layer is twice or more the width of the electrode.

A solar cell module according to the present invention includes a plurality of the above panels.

A printing apparatus according to the present invention includes a printing section configured to print ink on a surface of a substrate. The printing section includes a conductive ink printing machine configured to print conductive ink and an anti-oxidation ink printing machine configured to print anti-oxidation ink.

In one embodiment, the printing apparatus further includes a conveyor configured to convey the substrate.

In one embodiment, the conductive ink printing machine includes a first printing machine configured to print first conductive ink and a second printing machine configured to print second conductive ink on the first conductive ink.

A printing method according to the present invention is a printing method for printing ink on a surface of a substrate, including printing conductive ink on the surface of the substrate and printing anti-oxidation ink to cover the conductive ink.

A method for producing a panel according to the present invention includes preparing a substrate having a surface, printing conductive ink on the surface of the substrate, printing anti-oxidation ink to cover the conductive ink, and heating the conductive ink and the anti-oxidation ink.

ADVANTAGEOUS EFFECTS OF INVENTION

According to the present invention, a panel, a method for producing a panel, a solar cell module including a panel, a printing apparatus, and a printing method can be provided in which the degree of freedom of electrode design is increased.

DESCRIPTION OF EMBODIMENTS

With reference to the accompanying drawings, a panel, a method for producing a panel, a solar cell module, a printing apparatus, and a printing method according to the present invention will be described below. Although a solar panel is described as an example in the embodiments of the present invention, it is understood that the present invention is not limited the embodiments.

First Embodiment

Figure 1:
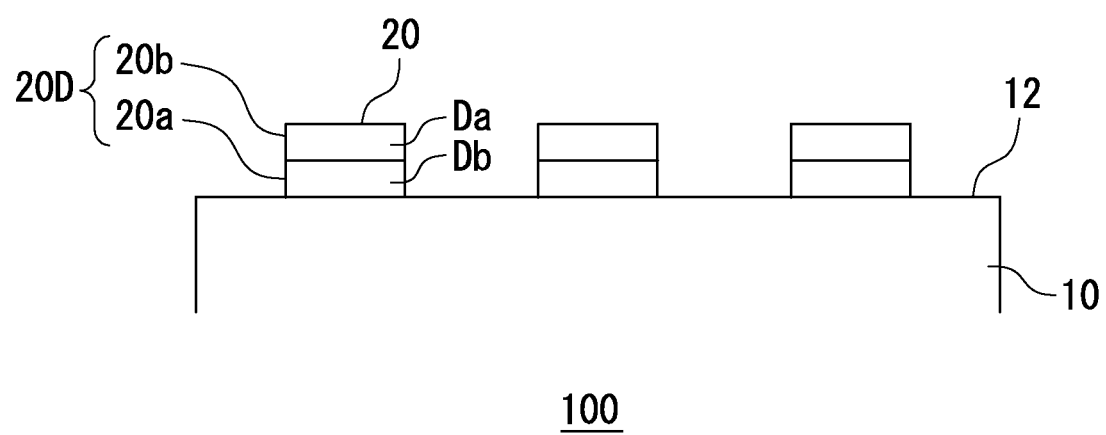
FIG. 1 is a schematic cross sectional view of a first embodiment of a panel according to the present invention.

The first embodiment of a panel according to the present invention will be described below with referent to the accompanying drawings. FIG. 1 is a schematic cross sectional view of a panel 100. Here, the panel 100 is a solar panel. The vicinity of one of the principal planes of the panel 100 is shown in FIG. 1 on an enlarged scale.

The panel 100 includes a substrate 10 and an electrode 20 provided on a surface 12 of the substrate 10. Although the electrode 20 shown in FIG. 1 is separated, the separated electrodes 20 may be electrically connected together through another point to have almost the same potential.

Although not shown, the substrate 10 includes a photo-electric conversion layer. For example, the substrate 10 is a silicon substrate. The substrate 10 includes a p-type silicon layer and an n-type silicon layer. Specifically, the photoelectric conversion layer may contain amorphous silicon or crystalline silicon. For example, the photoelectric conversion layer may contain single crystalline silicon, polycrystalline silicon, or microcrystalline silicon.

Referring to FIG. 1 showing the cross section, the electrode 20 extends in a predetermined direction. The electrode 20 of the panel 100 has a layered structure 20D. Here, the electrode 20 has a two-layer structure and includes a conductive layer 20a in contact with the surface 12 of the substrate 10 and a conductive layer 20b provided on the conductive layer 20a. The conductive layer 20a contains a conductive material Da, while the conductive layer 20b contains a conductive material Db different from the conductive material Da.

The conductive material Da is a single substance or a mixture of silver, copper, gold, carbon, cobalt, titanium, nickel, aluminum, etc., for example. Also, the conductive material Db different from the conductive material Da is a single substance or a mixture of silver, copper, gold, carbon, cobalt, titanium, nickel, aluminum, etc., for example. It is appreciated that the conductive materials Da, Db are not exactly the same. If either one of the conductive materials Da, Db is a mixture, one conductive material of the mixture may be or may not be contained in the other conductive material. Further, when both the conductive materials Da, Db are mixtures, a given conductive material in either one of the conductive materials may be or may not be contained in the other conductive material. Preferably, the conductive material Da is silver, while the conductive material Db is any one of copper, gold, carbon, cobalt, titanium, nickel, and aluminum, or a mixture containing at least two selected from the group consisting of silver, copper, gold, carbon, cobalt, titanium, nickel, and aluminum.

Here, the conductive layer 20a and the conductive layer 20b contain a single conductive material Da and a single conductive material Db, respectively. For example, the conductive material Da is silver, while the conductive material Db is copper. It is appreciated that the conductive material Da is suitably selected according to the material forming the surface 12 of the substrate 10. For example, when the surface 12 is made of silicon, the use of silver as the conductive material Da can reduce the contact resistance. Typically, metal materials having low resistivity are used as the conductive materials Da, Db. In the present specification, the conductive materials Da, Db may be referred to as a first conductive material Da and a second conductive material Db, respectively. Also, the conductive layers 20a, 20b may be referred to as a first conductive layer 20a and a second conductive layer 20b, respectively. The width of the conductive layer 20a is almost equal to the width of the conductive layer 20b.

Since the electrode 20 has the layered structure 20D as described above, the sectional area can be increased even with a comparatively small width of the electrode 20, thereby achieving low resistance. Further, the conductive layer 20b contains the conductive material Db different from the conductive material Da of the conductive layer 20a. This permits selection of the conductive material Db of the conductive layer 20b substantially regardless of what the material of the surface 12 of the substrate 10 is, thereby increasing the degree of freedom of designing the electrode 20. In addition, in the panel 100, the conductive layer 20a containing silver and the conductive layer 20b containing copper are layered, thereby suppressing an increase in resistance of the electrode 20 itself and reducing the used amount of expensive silver.

Figure 2:
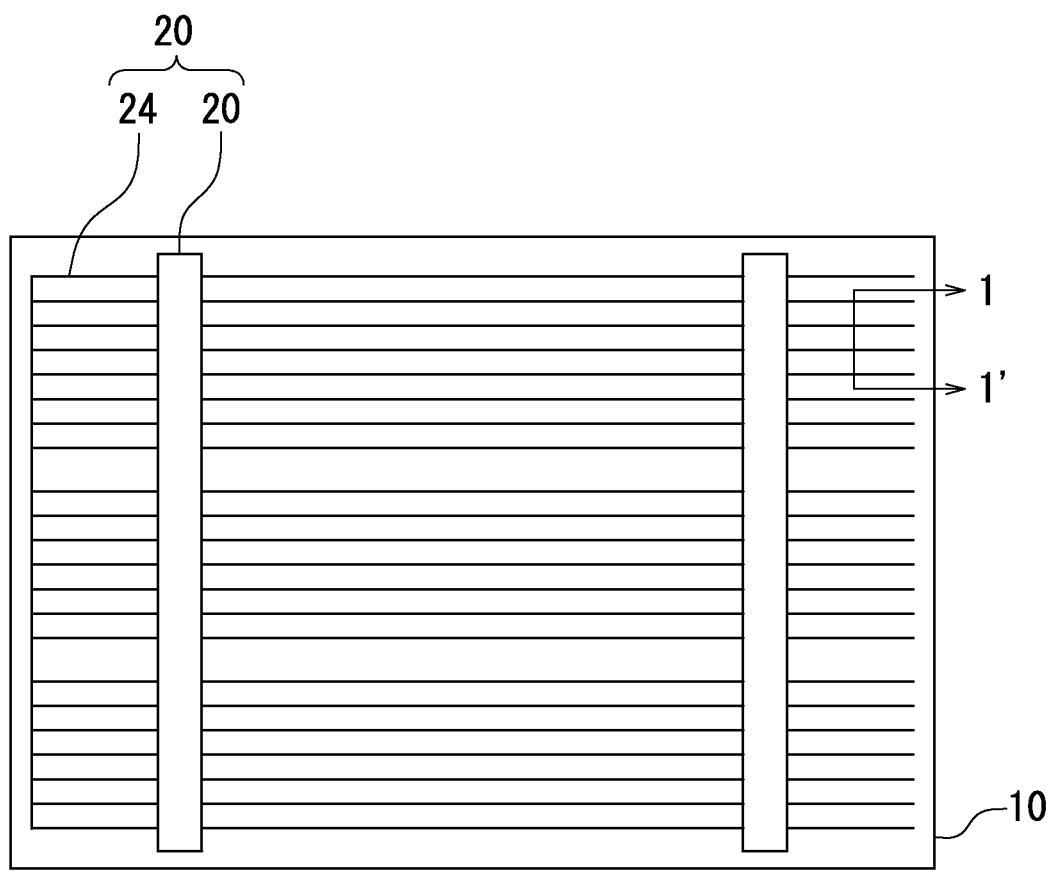
FIG. 2 is a top view of the panel shown in FIG. 1.

FIG. 2 is a schematic diagram showing a light receiving plane of the panel 100. The electrode 20 includes bus bar electrodes 22 and finger electrodes 24. The electrode 20 may be called a collector electrode. The finger electrodes 24 extend from each bus bar electrode 22. Typically, the finger electrodes 24 are arrayed at regular intervals. In general, the width of the bus bar electrodes 22 is larger than the width of the finger electrodes 24. It should be noted that FIG. 1 is a cross sectional view taken along the line 1-1' in FIG. 2.

For example, the panel 100 is in a rectangular shape having a principal plane with a length of 170 mm and a width of 170 mm. Further, for example, the bus bar electrodes 22 have a width of 2 mm or larger and 3 mm or smaller, while the finger electrodes 24 have a width of 15 µm or larger and 70 µm or smaller. Each interval of the finger electrodes 24, that is, the distance between the center of a given finger electrode 24 and the center of an adjacent finger electrode 24 is 2 mm. With too large intervals of the finger electrodes 24, an insufficient amount of carriers generated in the substrate 10 reach the finger electrodes 24, thereby achieving inefficient current extraction. By contrast, with too small intervals of the finger electrodes 24, the number of the finger electrodes 24 increases to reduce the opening area.

Figure 3:
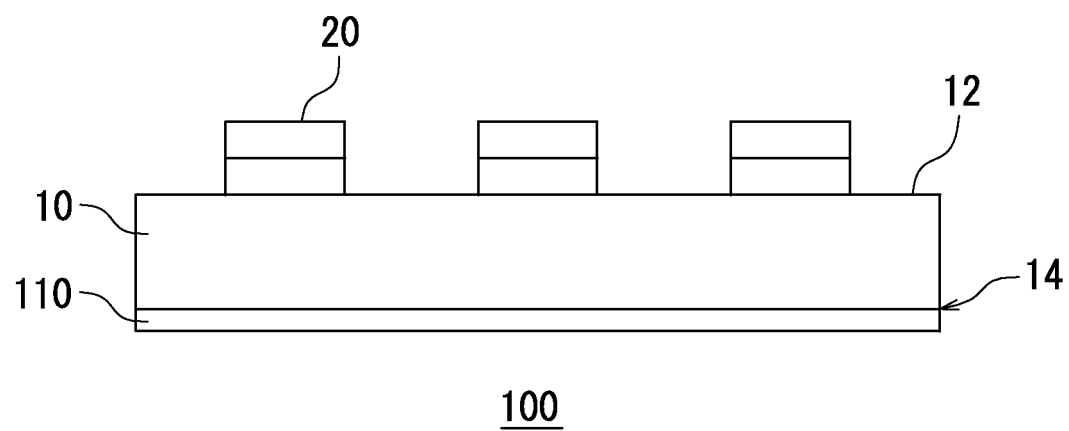
FIG. 3 is a schematic cross sectional view showing the entirety of the panel shown in FIG. 1.

FIG. 3 is a schematic diagram of the panel 100. The panel 100 includes not only the electrode 20 provided on the surface 12 of the substrate 10 but also an electrode 110 provided on an opposite surface 14 of the substrate 10. Typically, the electrode 110 is provided so as to cover the entirety of the opposite surface 14 of the substrate 10. For example, the electrode 110 is made of aluminum.

Figure 4A:
FIG. 4A and FIG. 4B are schematic diagrams for explaining a method for producing the panel shown in FIG. 1.
Figure 4B:
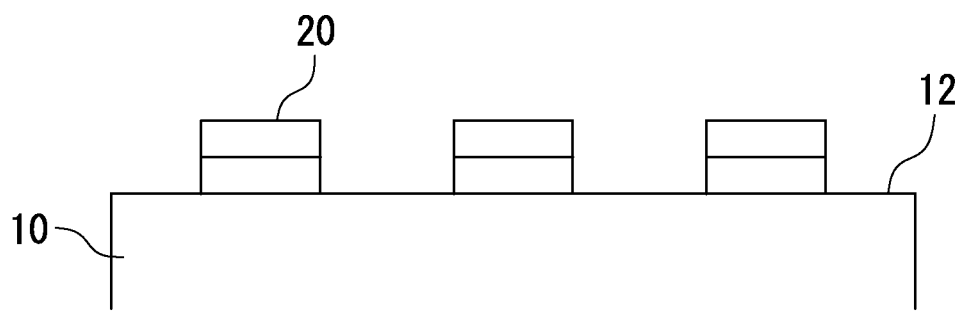

A method for suitably producing the panel 100 will be described below with reference to FIG. 4. As shown in FIG. 4A, the substrate 10 having the surface 12 is prepared. As described above, the substrate 10 is a silicon substrate, for example. Next, as shown in FIG. 4B, the electrode 20 is formed on the surface 12 of the substrate 10. The electrode 20 is formed by printing, for example.

Figure 5A:
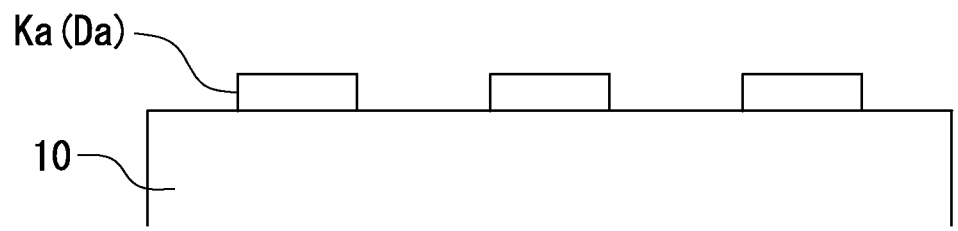
FIGS. 5A-5C are schematic diagrams for explaining a printing method used for forming an electrode of the panel shown in FIG. 1.

A method for forming the electrode 20 will be described below with reference to FIG. 5. As shown in FIG. 5A, conductive ink Ka containing the conductive material Da is printed on the substrate 10. For example, the conductive ink Ka contains the conductive material Da in particulate form and a vehicle. The vehicle contains resin and a solvent. The conductive ink Ka has appropriate thixotropy.

As described above, the conductive material Da is a single substance or a mixture of silver, copper, gold, carbon, cobalt, titanium, nickel, aluminum, etc. The resin may be called binder resin. Examples of the resin include thermosetting resin, such as polyester/melamine resin, UV curable resin, such as acrylic resin, thermoplastic resin, such as polyester resin, and the like. Further, the solvent is a low-temperature-volatile solvent that volatilizes at room temperature, for example. Specifically, the solvent is a glycol ether solvent.

Figure 5B:
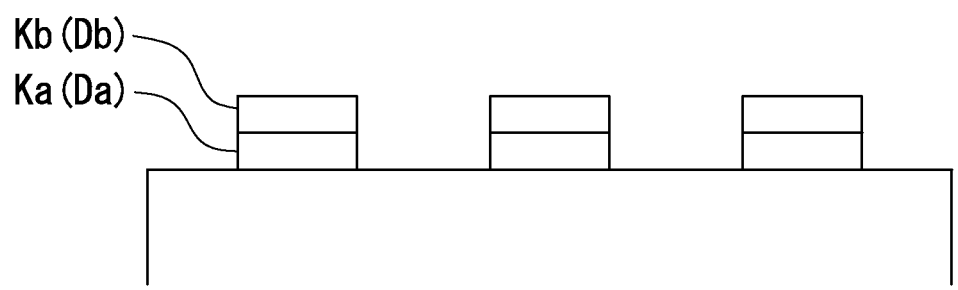

Subsequently, as shown in FIG. 5B, conductive ink Kb containing the conductive material Db different from the conductive material Da is printed on the conductive ink Ka. As described above, the conductive material Db different from the conductive material Da is a single substance of silver, copper, gold, carbon cobalt, titanium, nickel, aluminum, etc., or a mixture containing at least two selected from the group of them. For example, the conductive ink Kb contains the conductive material Db in particulate form and a vehicle. The vehicle contains resin and a solvent. The vehicle of the conductive ink Kb may be the same as that of the conductive ink Ka, or the vehicle of the conductive ink Kb may be similar to that of the conductive ink Ka. Thus, the conductive ink is printed on the substrate 10. It should be noted that in the present specification, the conductive ink Ka, Kb may be referred to as first conductive ink Ka and second conductive ink Kb, respectively.

Figure 5C:
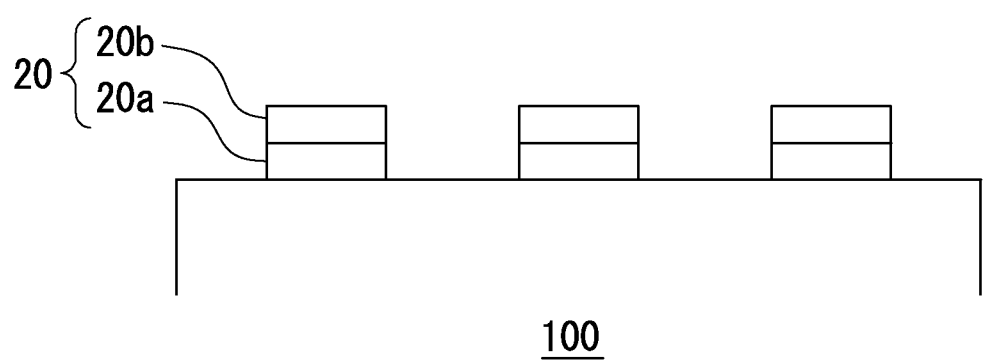

Thereafter, as shown in FIG. 5C, the first conductive ink Ka and the second conductive ink Kb are heated. The heating temperature is 500° C. or higher and 850° C. or lower, for example. This bakes the conductive material Da to form the first conductive layer 20a containing the conductive material Da and bakes the conductive material Db to form the second conductive layer 20b containing the conductive material Db. It is appreciated that the first conductive layer 20a is formed according to the shape of the conductive ink Ka, while the second conductive layer 20b is formed according to the shape of the conductive ink Kb.

The production method and the printing method described with reference to FIGS. 4 and 5 are performed suitably using a printing apparatus as described below.

One embodiment of a printing apparatus according to the present invention will be described with reference to FIG. 6. A printing apparatus 200 of the present embodiment includes a conveyor 210 configured to convey the substrate 10, a printing section 220, and a heater 230. The printing section 220 includes a plurality of printing machines. The number of the printing machines corresponds to the number of layers of the layered structure of the electrode 20. Here, the printing section 220 includes a printing machine 220a configured to print the conductive ink Ka containing the conductive material Da and a printing machine 220b configured to print the conductive ink Kb containing the conductive material Db different from the conductive material Da.

First, the substrate 10 is place on the conveyor 210, which is rotating. The conveyor 210 conveys the substrate 10. When the substrate 10 conveyed by the conveyor 210 reaches below the printing machine 220a, the printing machine 220a prints the conductive ink Ka on the substrate 10.

Next, when the substrate 10 conveyed by the conveyor 210 reaches below the printing machine 220b, the printing machine 220b prints the conductive ink Kb on the substrate 10. It should be noted that the conveying speed of the conveyor 210 and the printing of the printing machines 220a, 220b are set so that the conductive ink Kb is layered on the conductive ink Ka.

Subsequently, the conveyor 210 conveys the substrate 10, on which the conductive ink Ka, Kbe are layered, to the heater 230. The substrate 10 is heated in the heater 230, thereby baking the conductive ink Ka, Kb. This forms the conductive layer 20a containing the conductive material Da from the conductive ink Ka and forms the conductive layer 20b containing the conductive material Db from the conductive ink Kb. Thus, the electrode 20 including the conductive layers 20a, 20b containing the different conductive materials is formed.

Figure 7:
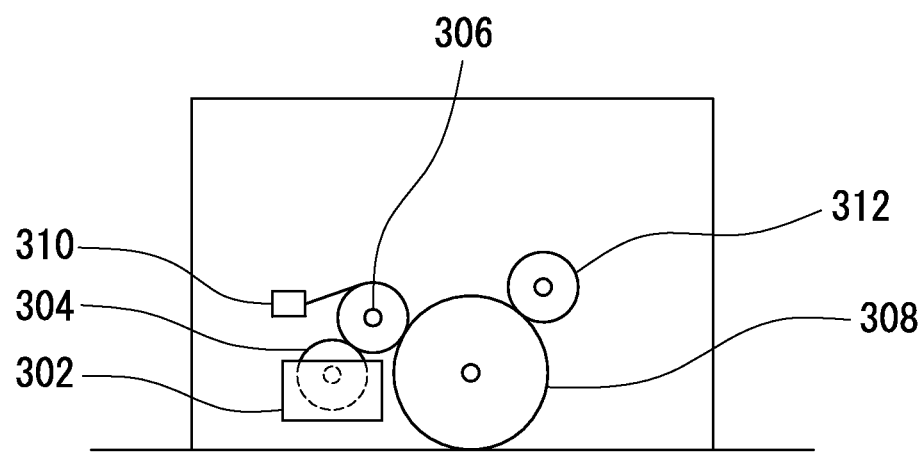
FIG. 7 is a schematic diagram showing one example of a printing machine of the printing apparatus shown in FIG. 6.

FIG. 7 is a schematic diagram showing one example of the printing machine 220a. The printing machine 220a includes an ink tray 302, an ink supply roll 304, an intaglio printing roll 306, a transfer roll 308, a scraper 310, and a cleaning roll 312. In the printing machine 220a, the conductive ink Ka in the ink tray 302 is moved from the ink supply roll 304 to the peripheral surface of the intaglio printing roll 306, is moved further to the peripheral surface of the transfer roll 308, and then is transferred to the surface of the substrate 10, which is continuously passing below the transfer roll 308. Such printing may be called offset printing or gravure offset printing.

Detailed description will be provided below. The conductive ink Ka to be printed on the substrate 10 is filled in the ink tray 302. When the conductive ink Ka in the ink tray 302 decreases, the conductive ink Ka is filled into the ink tray 302 from a pump (not shown) below. The ink tray 302 is located at the lower part of the printing machine 220a.

The lower part of the ink supply roll 304 is dipped in the conductive ink Ka in the ink tray 302. The ink supply roll 304 rotates while being dipped in the conductive ink Ka in the ink tray 302. The conductive ink Ka attached to the ink supply roll 304 is transferred to the intaglio printing roll 306. It should be noted that the scraper 310 is provided in the vicinity of the intaglio printing roll 306. Before the intaglio printing roll 306 gets out from the conductive ink Ka in the ink tray 302 and comes into contact with the transfer roll 308, the scraper 310 removes surplus conductive ink Ka attached to the intaglio printing roll 306.

Recesses are formed in the surface portion of the intaglio printing roll 306. The recesses correspond to the lines, figures, patterns, etc., which are to be printed on the substrate 10. For example, the intaglio printing roll 306 has an outer diameter of 100 mm and a width of 145 mm. It is appreciated that the conductive ink Ka is transferred correspondingly to the recesses of the intaglio printing roll 306. For example, in order to form the finger electrodes 24 (FIG. 2) having a width of 30 μm, the corresponding width of the recesses of the intaglio printing roll 306 is 30 μm.

The conductive ink Ka attached to the recesses of the intaglio printing roll 306 is attached to the transfer roll 308. The transfer roll 308 rotates while coming in contact with the peripheral surface of the intaglio printing roll 306 and presses the surface of the substrate 10 passing therebelow to transfer the conductive ink Ka to the substrate 10. The transfer roll 308 is made of a material excellent in detachability so that the conductive ink Ka can be smoothly and reliably transferred to the surface of the substrate 10 from the transfer roll 308. For example, the transfer roll 308 is made of a given type of silicone rubber. The transfer roll 308 has an outer diameter of 200 mm and a width of 135 mm. It should be noted that the cleaning roll 312 is provided in the vicinity of the transfer roll 308. The cleaning roll 312 removes surplus conductive ink Ka attached to the transfer roll 308.

It is noted that though not shown, the printing machine 220b has a configuration similar to that of the aforementioned printing machine 220a, except that the conductive ink in the ink tray 302 is different. As described above, the printing apparatus 200 prints the conductive ink Ka, Kb by offset printing. Such offset printing can reduce each width of the conductive ink Ka, Kb, thereby enabling formation of an electrode 20 with a small width.

Although the electrode 20 has the two-layer structure, and the printing apparatus 200 includes the two printing machines 220a, 220b in the above description, it is appreciated that the present invention is not limited to the description. The electrode 20 may have a three- or more-layer structure, and the printing section 220 may include three or more printing machines.

Further, although the number of layer types of the layered structure 20D is equal to the number of the printing machines of the printing section 220 in the above description, it is appreciated that the present invention is not limited to the description. The number of layer types of the layered structure 20D may be smaller than the number of the printing machines in the printing section 220. For example, in the printing section 220, each of two printing machines may print a layer of conductive ink containing silver as a conductive material to form two-layer conducive ink, and then another printing machine may print a layer of conductive ink containing another conductive material (e.g., copper) on the two-layer conductive ink.

Further, in the above description, the intaglio printing roll 306 in each printing machine 220a, 220b corresponds to both the bus bar electrodes 22 and the finger electrodes 24, and the printing section 220 prints the conductive ink corresponding to the electrode 20 including the bus bar electrodes 22 and the finger electrodes 24 at one time. However, the present invention is not limited the description. The printing section 220 may form one of the bus bar electrodes 22 and the finger electrodes 24 first, and then form the other thereafter. For example, the intaglio printing roll 306 of each printing machine 220a, 220b can correspond to the finger electrodes 24. The printing sections 220a, 220b may print conductive ink corresponding to the finger electrodes 24, and then, another printing machine (not shown) prints conductive ink corresponding to the bus bar electrodes 22.

Figure 6:
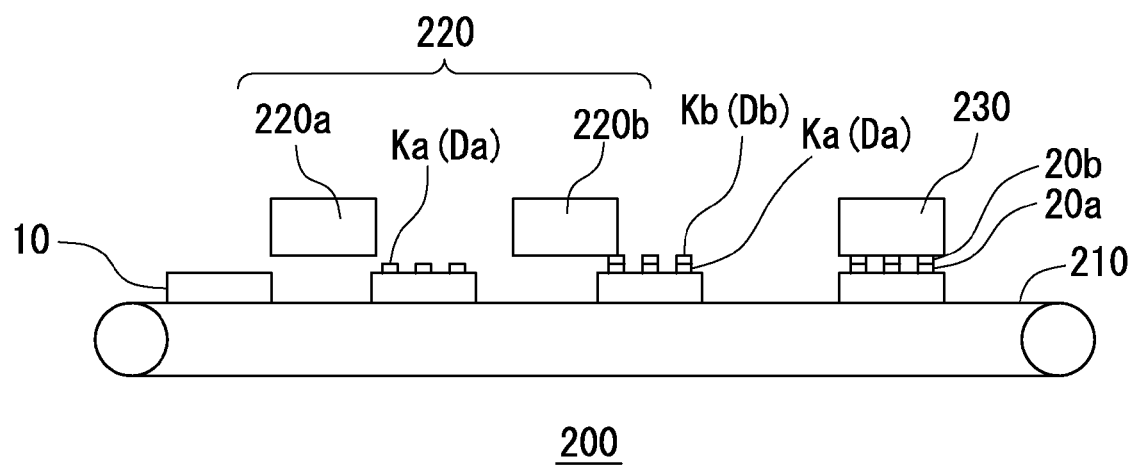
FIG. 6 is a schematic diagram showing the first embodiment of a printing apparatus according to the present invention.

Although the conveyor 210 of the printing apparatus 200 shown in FIG. 6 conveys the substrate 10 linearly, it is appreciated that the present invention is not limited to the drawing. The conveyor 210 may convey the substrate 10 windingly. For example, the conveyor 210 may convey the substrate 10 in a loop manner. Such a loop conveyor 210 may be called a turntable.

Furthermore, although the conveyor 210 of the printing apparatus 200 shown in FIG. 6 conveys the substrate 10 in one direction, the present invention is not limited to the drawing. The conveyor 210 may convey the substrate 10 in a bidirectional manner. For example, the printing section 220 can include only one printing machine 220a. In this case, the conveyor 210 may convey the substrate 10 in one direction while the printing machine 220a is set printable to perform printing. Then, the conveyor 210 can convey the substrate 10 in the opposite direction while the printing machine 220a is set unprintable. Then, the conductive ink is exchanged, and the conveyor 210 can convey the substrate 10 again in the one direction while the printing machine 220a is set printable to perform printing again. Thus, the layered structure 20D is obtained.

Second Embodiment

Figure 8:
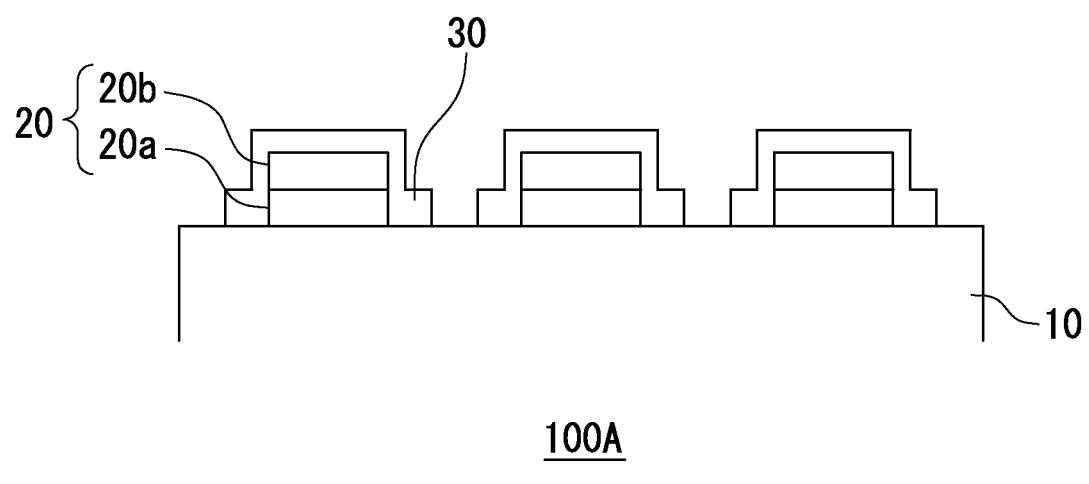
FIG. 8 is a schematic cross sectional view showing a second embodiment of a panel according to the present invention.

The second embodiment of a panel according to the present invention will be described below with reference to FIG. 8. A panel 100A of the present embodiment has a configuration similar to that of the panel 100 as described above with reference to FIGS. 1-3 except additional inclusion of an anti-oxidation layer. In order to avoid redundancy, duplicated description is omitted. Here, the electrode 20 also includes the conductive layer 20a and the conductive layer 20b, which have almost the same width.

In addition to the substrate 10 and the electrode 20, the panel 100A further includes an anti-oxidation layer 30. The width of the anti-oxidation layer 30 is larger than that of the conductive layers 20a, 20b. The anti-oxidation layer 30 can prevent oxidation of at least part of the electrode 20. For example, as described above, where the conductive layer 20a contains silver, while the conductive layer 20b contains copper, copper tends to be oxidized. The oxidation may accompany an increase in specific resistance. However, provision of the anti-oxidation layer 30 can reduce the oxidation to suppress the increase in specific resistance. Further, although silver is comparatively hard to be oxidized, strictly speaking, even the conductive layer 20a of which main component is silver may be degraded with time. Provision of the anti-oxidation layer 30 can reduce the degradation. As such, the panel 100A including the anti-oxidation layer 30 can prevent oxidation of at least part of the conductive layers 20a, 20b to reduce degradation of the characteristics of the panel 100A.

For example, the anti-oxidation layer 30 can be suitably made of a transparent conductive material. Specific examples of the transparent conductive material include indium tin oxide (ITO). Alternatively, the transparent conductive material may be zinc oxide or tin oxide. It is appreciated that the anti-oxidation layer 30 may contain a non-conductive transparent material. Or, the anti-oxidation layer 30 may contain an opaque conductive material. However, it is preferable that the anti-oxidation layer 30 contains a transparent conductive material. This can increase the intervals of the finger electrodes 24. Further, as described above, the electrode 20 is separated so as to be provided in parallel to each other, and the anti-oxidation layer 30 herein is separate to cover the electrode 20.

Figure 9A:
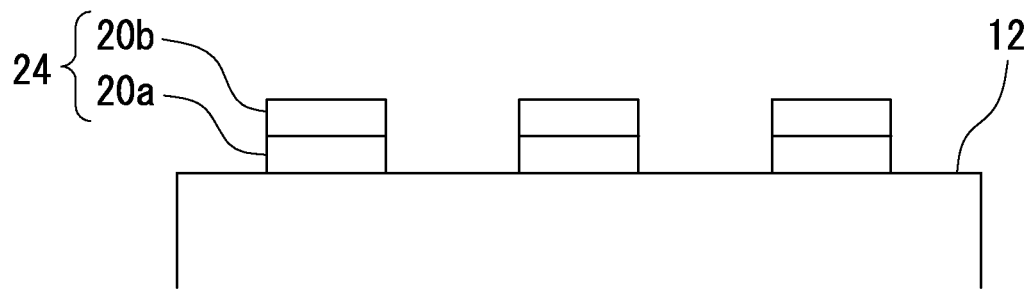
FIG. 9A is a schematic cross sectional view of the panel shown in FIG. 1.

The advantages of the anti-oxidation layer 30 being made of a transparent conductive material will be described below with reference to FIG. 9. FIG. 9A is a schematic cross sectional view of the panel 100 as described above with reference to FIGS. 1-3. FIG. 9A is similar to FIG. 1, except that the electrode 20 provided on the surface 12 of the substrate 10 is separated into four. As described above, the intervals of the finger electrodes 24 are set according to efficiency of extracting carriers generated in the substrate 10.

Figure 9B:
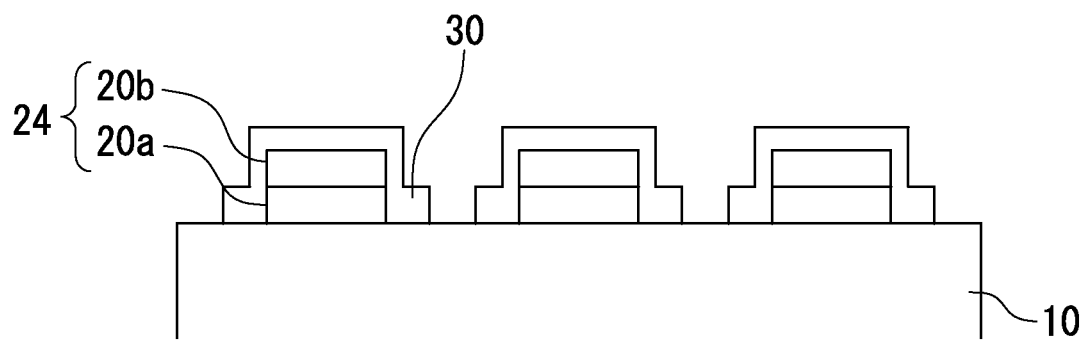
FIG. 9B is a schematic cross sectional view of the panel shown in FIG. 8.

FIG. 9B is a schematic cross sectional view of the panel 100A. As described above, the anti-oxidation layer 30 convers the electrode 20 in the panel 100A. When the anti-oxidation layer 30 is conductive, the carriers generated in the substrate 10 may reach not only the finger electrodes 24 but also the anti-oxidation layer 30, thereby enabling extraction of the generated carries as an electric current.

In the case that the intervals of the finger electrodes of the panel 100 are set at 2 mm, the intervals of the finger electrodes of the panel 100A can be set at 3 mm. For example, in the case that the principal planes of the panels 100, 100A are 170 mm wide and 170 mm long, the number of the finger electrodes is 85 in the panel 100, and the number of the finger electrodes is 56 in the panel 100A. Thus, with this panel 100A, the number of the electrodes 20 can be reduced to reduce the cost and increase the opening area for light. Preferably, the width of the anti-oxidation layer 30 is, for example, twice or more the width of the electrode 20.

The panel 100A can be suitably produced using a printing apparatus.

Figure 10:
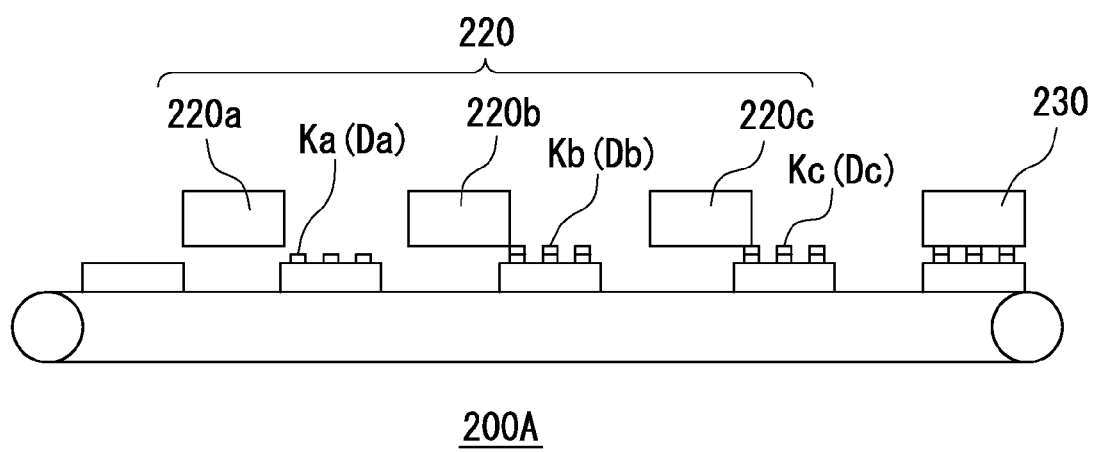
FIG. 10 is a schematic diagram showing a second embodiment of a printing apparatus according to the present invention.

A printing apparatus 200A will be described below with reference to FIG. 10. The printing apparatus 200A has a configuration similar to that of the printing apparatus 200 as described above with reference to FIG. 6, except that the printing section 220 includes an additional printing machine. In order to avoid redundancy, duplicated description is omitted. The printing section 220 of the printing apparatus 200A further includes a printing machine 220c between the printing machine 220b configured to print the conductive ink Kb and the heater 230. The printing machine 220c has a configuration similar to that of the printing machine 220a as described above with reference to FIG. 7, except that the ink in the ink tray 302 and the shape of the recesses formed in the intaglio printing roll 306 are different. In order to avoid redundancy, duplicated description is omitted.

Next, the printing machine 220c will be described with reference to FIG. 7. Ink Kc is filled in the ink tray 302 of the printing machine 220c. Here, the ink Kc contains particulate ITO and a vehicle. The vehicle contains resin and a solvent. In the present specification, the ink Kc may be referred to as anti-oxidation ink. Further, the printing machines 220a, 220b that print respectively the conductive ink Ka, Kb may be referred to as conductive ink printing machines, and the printing machine 220c that prints the anti-oxidation ink Kc may be referred to as an anti-oxidation ink printing machine in the present specification.

The vehicle of the anti-oxidation ink Kc may be the same as that of the conductive ink Ka or Kb. Alternatively, the vehicle of the conductive ink Kc may be similar to that of the conductive ink Ka or Kb. To the substrate 10, the ink Kc is transferred correspondingly to the recesses of the intaglio printing roll 306. For example, in order to form the anti-oxidation layer 30 with a width of 50 μm to cover the finger electrodes 24 with a width of 30 μm and a height of 50 μm, the width of the corresponding recesses of the intaglio printing roll 306 is set at, for example, 150 μm. Where parts of the anti-oxidation layer 30 which directly cover the substrate 10 on the opposite sides of each finger electrode 24 extend 10 μm, the width of the corresponding recesses of the intaglio printing roll 306 is set at 170 μm (e.g., 150 μm plus 10 μm plus 10 μm). Thus, the ink Kc is printed on the conductive ink Ka, Kb on the substrate 10. Thereafter, the conductive ink Ka, Kb and the anti-oxidation ink Kc are heated by the heater 230 (FIG. 10).

Figure 11:
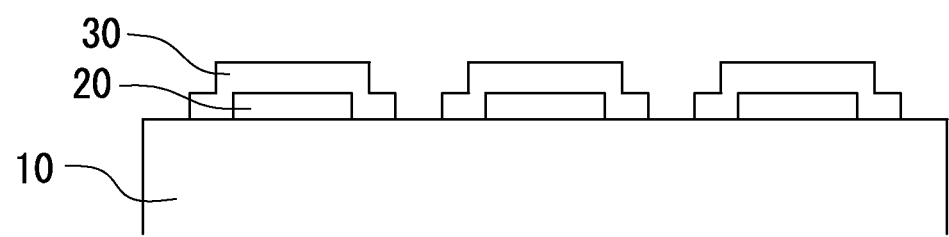
FIG. 11 is a schematic cross sectional view showing a modified example of the second embodiment of a panel according to the present invention.

Although the electrode 20 covered with the anti-oxidation layer 30 has different conductive layers 20a, 20b in the panel 100A in the above description, it is understood that the present invention is not limited to the description. As shown in FIG. 11, the electrode 20 may be formed of a single conductive layer in a panel 100B of the present embodiment. For example, the surface 12 of the substrate 10 may be made of silicon, and the electrode 20 may be formed of a conductive layer of which main component is silver.

Third Embodiment

The third embodiment of a panel according to the present invention will be described below with reference to FIG. 12. A panel 100C according to the present embodiment has a configuration similar to that of the panel 100 as described above with reference to FIGS. 1-3, except that the sectional area of each electrode 24 extending in the predetermined direction (x-direction herein) varies according to its position. In order to avoid redundancy, duplicated description is omitted.

Figure 12A:
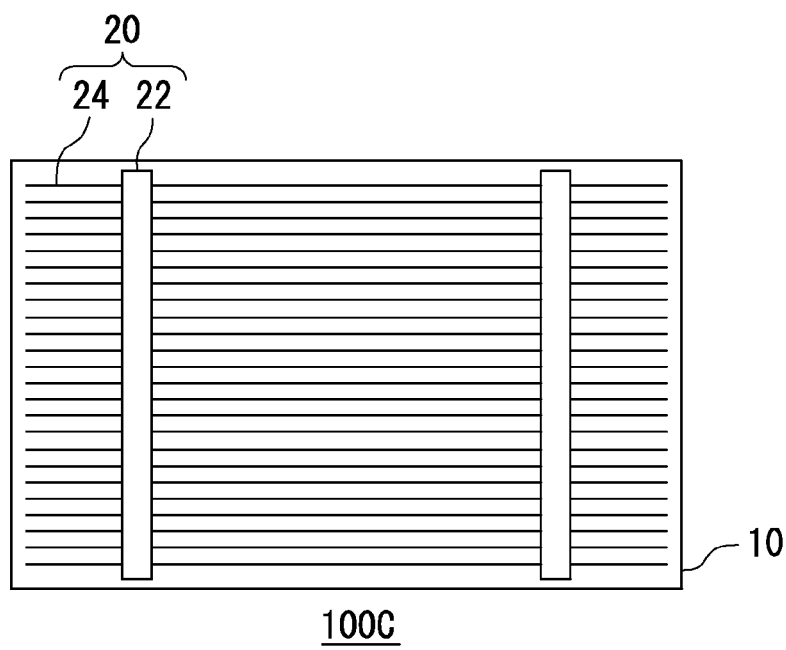
FIG. 12A is a schematic top view showing a third embodiment of a panel according to the present invention.

FIG. 12A is a schematic top view of the panel 100C. The electrode 20 of the panel 100C includes linear electrodes 22, 24. Here, the linear electrodes 22 extend in the Y-direction, while the linear electrodes 24 extend in the X-direction from the linear electrodes 22. In the following description of the present specification, the linear electrodes 22, 24 may be referred to as first linear electrodes 22 and second linear electrodes 24, respectively. Here, both the linear electrodes 22, 24 have linear shape and orthogonal to each other. However, at least one of the linear electrodes 22, 24 may be bent or curved. It should be noted that in the present specification, first linear electrodes 22 adjacent to each other and extending in parallel in the predetermined direction may be referred to as first and second parallel electrodes 22a, 22b, while the second linear electrodes 24 intersecting the first and second parallel electrodes 22a, 22b may be referred to as crossed electrodes.

For example, where the panel 100C is a solar panel, the linear electrodes 22 may be called bus bar electrodes, while the linear electrodes 24 may be called finger electrodes. As shown in FIG. 12A, the plural bus bar electrodes 22 extend in parallel to each other in the Y-direction, and the finger electrodes 24 intersect the bus bar electrodes 22. Here, the finger electrodes 24 extend in parallel to each other in the X-direction, and the bus bar electrodes 22 are arranged so as to be orthogonal to the finger electrodes 24.

Figure 12B:
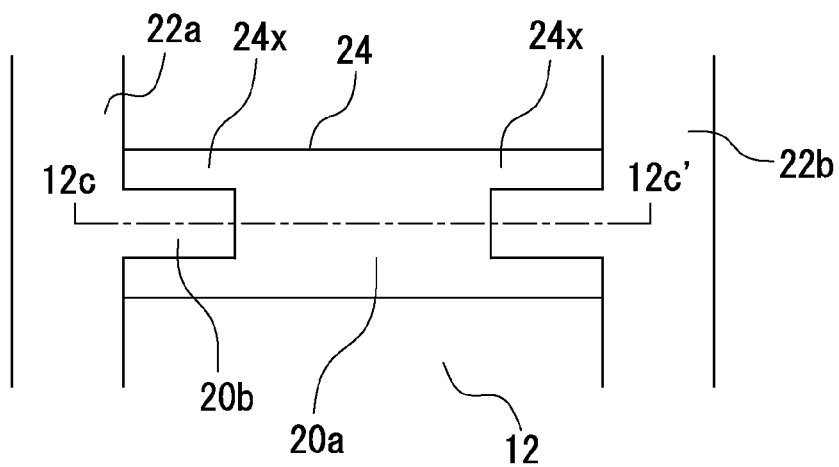
FIG. 12B is a partially enlarged view of FIG. 12A.
Figure 12C:
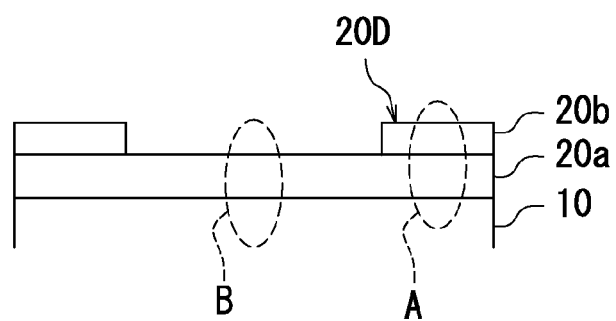
FIG. 12C is a schematic cross sectional view thereof.

FIG. 12B is a partially enlarged view of the panel 100C. FIG. 12C is a schematic cross sectional view of the panel 100C. FIG. 12C shows a cross section taken along the line 12c-12c' in FIG. 12B.

As described above, the linear electrodes 24 extend from the linear electrodes 22. Each linear electrode 24 of the panel 100C includes sectional area decreasing parts 24x of which the area in section (sectional area) orthogonal to the longitudinal direction of the linear electrode 24 decreases in a direction away from the linear electrodes 22. Although each linear electrode 24 includes two sectional area decreasing parts 24x in FIG. 12B, it is appreciated that each linear electrode 24 may include only one sectional area decreasing part 24x. Further, here, the number of layers at the part having the smallest sectional area in each of the two sectional area decreasing parts 24x is one, while the number of layers at the part having the largest sectional area therein is two. As such, the number of layers at the part having the smallest sectional area may be smaller than that of the layers at the part having the largest sectional area.

Here, the electrode 20 has the layered structure 20D including the first conductive layer 20a and the second conductive layer 20b. For example, the first conductive layer 20a contains silver, while the second conductive layer 20b contains copper. In the panel 100C, the first conductive layer 20a is provided in both of the bus bar electrodes 22 and the finger electrodes 24. By contrast, the second conductive layer 20b is selectively provided in at least one of the bus bar electrodes 22 and the finger electrodes 24. Here, the second conductive layer 20b is provided at a part of each finger electrode 24 which is near a bus bar electrode 22 and is not provided at the central part of each finger electrode 24. Accordingly, in each finger electrode 24, the sectional area of a part A near a bus bar electrode 22 is larger than the sectional area of a part B apart from the bus bar electrode 22. The carriers formed in the substrate 10 are extracted through the electrode 20 therearound, thereby increasing the electric current at the part A of each finger electrode 24 which is near a bus bar electrode 22. In each finger electrode 24 electrically connected to two adjacent bus bar electrodes 22, the sectional area of a part near a bus bar electrode 22 is larger than the sectional area of the central part of the finger electrode 24. This can reduce the cost of the material for the finger electrodes 24 without reducing the current extracting efficiency.

Moreover, in each finger electrode 24 of the panel 100C, the second conductive layer 20b is shorter than the first conductive layer 20a, and the width of the second conductive layer 20b is smaller than the width of the first conductive layer 20a. Here, each length of the first and second conductive layers 20a, 20b means the distance in the direction where the electric current flows from the finger electrodes 24 to the bus bar electrodes 22, and each width of the first and second conductive layers 20a, 20b means the distance in the direction orthogonal to the direction where the electric current flows from the finger electrodes 24 to the bus bar electrodes 22 as viewed in the normal direction of the surface 12 of the substrate 10. The second conductive layer 20b shorter than the first conductive layer 20a means that in the panel 100C, the second conductive layer 20b is provided in the form of islands on the first conductive layer 20a, and adjacent islands of the second conductive layer 20b are electrically connected together through the first conductive layer 20a.

In the panel 100c, when the electrode 20 is viewed in the normal direction of the surface 12 of the substrate 10, the sectional area around the central part of each crossed electrode 24 is smaller than the sectional area of a part of each crossed electrode 24 which is near the first parallel electrode 22a and the sectional area of a part of each crossed electrode 24 which is near the second parallel electrode 22b. Also, when the electrode 20 is viewed in the normal direction of the surface 12 of the substrate 10, the width around the central part of each crossed electrode 24 is smaller than the width of a part of each crossed electrode 24 which is near the first parallel electrode 22a and the width of a part of each crossed electrode 24 which is near the second parallel electrode 22b.

The second conductive layer 20b is shorter than the first conductive layer 20a, and the width of the second conductive layer 20b is smaller than the width of the first conductive layer 20a in the above description. However, it is appreciated that the present invention is not limited to the description. Where the width of the second conductive layer 20b is smaller than the width of the first conductive layer 20a, the length of the second conductive layer 20b may be equal to that of the first conductive layer 20a, and adjacent bus bar electrodes 22 may be electrically connected together through not only the first conductive layer 20a but also the second conductive layer 20b. Alternatively, where the second conductive layer 20b is shorter than the first conductive layer 20a, the width of the first conductive layer 20a may be equal to the width of the second conductive layer 20b. As such, it is preferable that at least one of the width and the length of the second conductive layer 20b is smaller than that of the first conductive layer 20a.

It should be noted that the electrode 20 of the panel 100C can be produced using, for example, the printing apparatus 200 as described above with reference to FIG. 6. In this case, the shape and size of the first conductive layer 20a shown in FIG. 12B correspond to those of the first conductive ink Ka, and the shape and size of the second conductive layer 20b shown in FIG. 12C correspond to those of the second conductive ink Kb.

The width of the finger electrodes 24 is constant in the panel 100C as described with reference to FIG. 12. However, it is appreciated that the present invention is not limited to the above description.

Figure 13A:
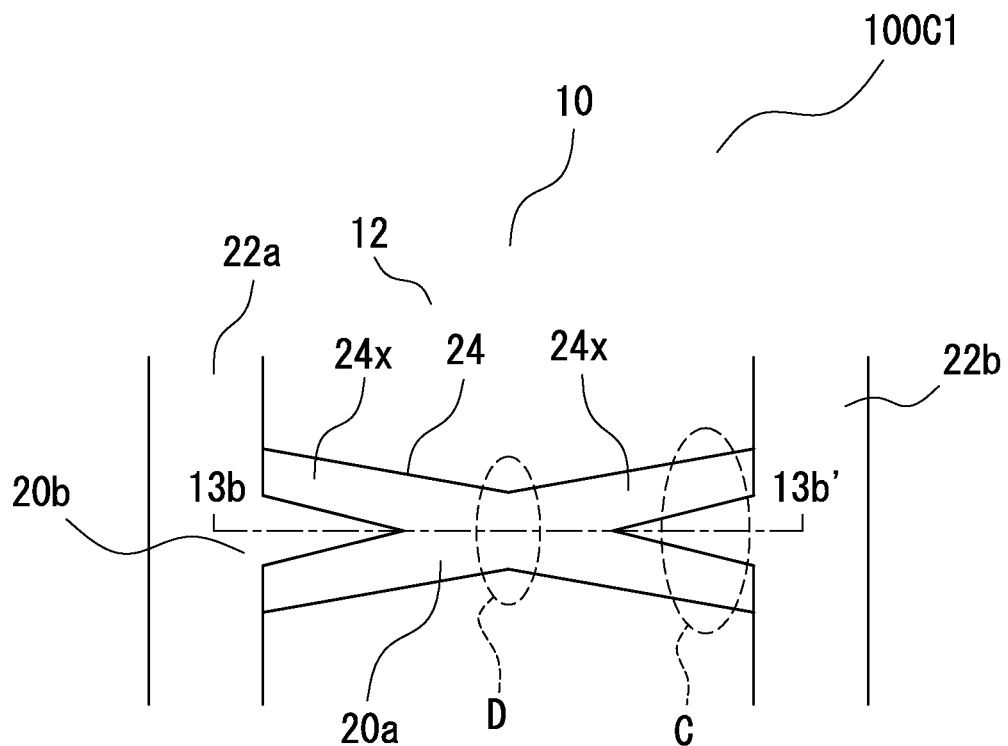
FIG. 13A is a schematic view showing a modified example of the third embodiment of a panel according to the present invention.
Figure 13B:
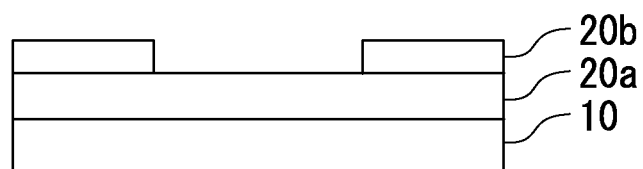
FIG. 13B is a schematic cross sectional view thereof.

FIG. 13A is a partially enlarged view of a panel 100C1. FIG. 13B is a schematic cross sectional view of the panel 100C1. FIG. 13B shows a cross section taken along the line 13b-13b' in FIG. 13A.

Referring to the panel 100C1, the width of the respective two sectional area decreasing parts 24x in the electrode 20 continuously decreases in the direction away from the first linear electrodes 22 as viewed in the normal direction of the surface 12 of the substrate 10. As such, the sectional area of each second linear electrode 24 continuously decreases in the direction away from the first linear electrodes 22. This can increase the opening area of the surface 12 of the substrate 10.

For example, in the case that the panel 100C1 is used as a solar panel, the width around the central part D of each finger electrode 24 which is between adjacent bus bar electrodes 22 is smaller than the width of parts C thereof which are near the bus bar electrodes 22 as viewed in the normal direction of the surface 12 of the substrate 10. Specifically, of the first conductive layer 20a forming the finger electrodes 24, the width around the central part between adjacent bus bar electrodes 22 is smaller than the width of the parts near the bus bar electrodes 22. Further, the second conductive layer 20b forming the finger electrodes 24 is provided at parts C near the bus bar electrodes 22, but is not provided around the central part D between the adjacent bus bar electrodes 22. Accordingly, the resistance of the parts of finger electrodes 24 which are near the bus bar electrodes 22 can be reduced in the panel 100C1. In this manner, the sectional area of the parts C of the finger electrodes 24 which are near the bus bar electrodes 22 larger than that around the central parts D thereof can lead to reduction in material cost without reducing the current extracting efficiency. In addition, the opening area of the solar panel can be increased, thereby effectively generating the electric current.

The conductive layers 20a, 20b of the electrode 20 in the panels 100C and 100C1 are made of the different conductive materials in the above description. However, it is appreciated that the present invention is not limited to the description. The conductive layers 20a, 20b may be made of the same conductive material.

Figure 14A:
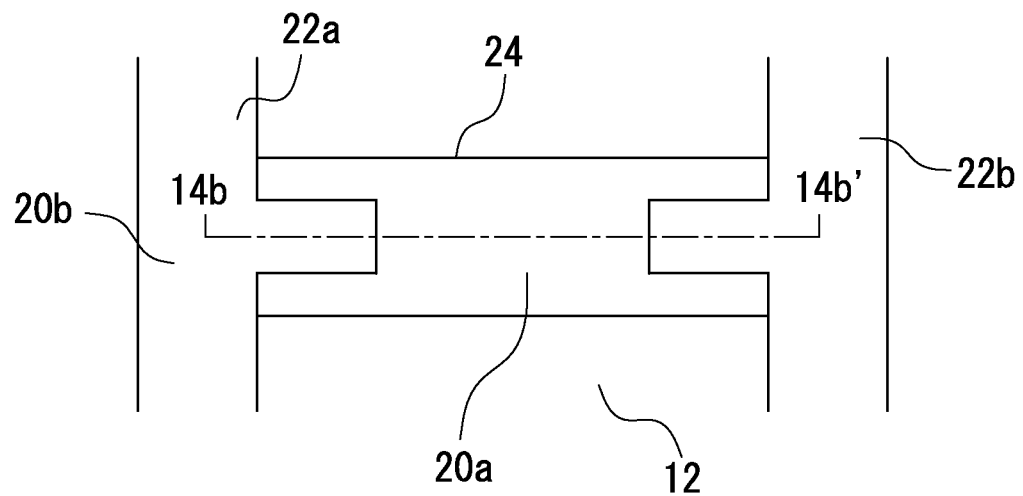
FIG. 14A is a schematic diagram showing another modified example of the third embodiment of a panel according to the present invention.
Figure 14B:
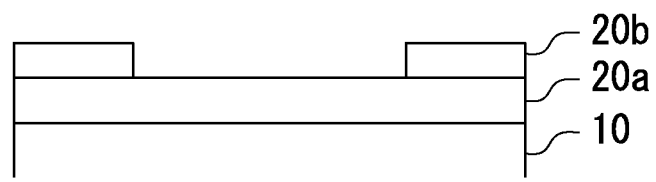
FIG. 14B is a schematic cross sectional view thereof.

A panel 100C2 will be described with reference to FIG. 14. FIG. 14A is a partially enlarged view of the panel 100C2. FIG. 14B is a schematic cross sectional view of the panel 100C2. FIG. 14B shows a cross section taken along the line 14b-14b' in FIG. 14A.

The panel 100C2 has a configuration similar to that of the panel 100C as described above with reference to FIG. 12, except that the conductive layers 20a, 20b are made of the same conductive material. Accordingly, in order to avoid redundancy, duplicated description is omitted. For example, both of the conductive layers 20a, 20b contain silver. It is appreciated that the width of the finger electrodes 24 of the panel 100C2, which is constant in FIG. 14, may vary like the panel 100C1 shown in FIG. 13.

Furthermore, in the above description, the electrode 20 includes a plurality of conductive layers 20a, 20b in the panel 100C1. However, the present invention is not limited to the above description.

Figure 15A:
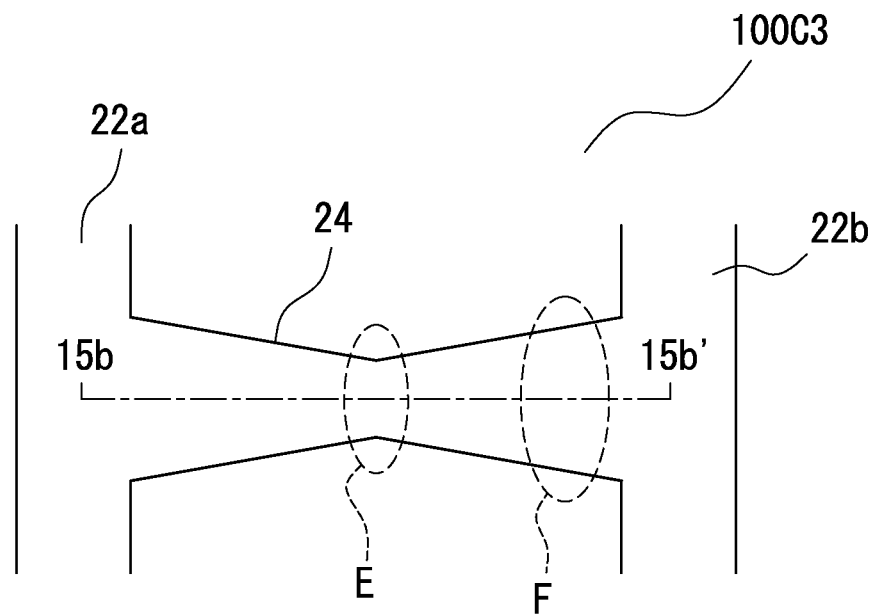
FIG. 15A is a schematic diagram showing still another modified example of the third embodiment of a panel according to the present invention.
Figure 15B:
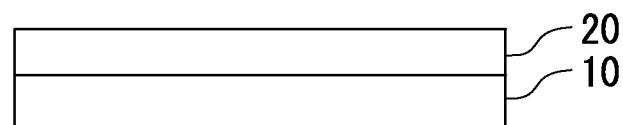
FIG. 15B is a schematic cross sectional view thereof.

FIG. 15A is a partially enlarged view of a panel 100C3. FIG. 15B is a schematic cross sectional view of the panel 100C3. FIG. 15B shows a cross section taken along the line 15b-15b' in FIG. 15B.

Referring to the panel 100C3, of the finger electrodes 24, the width around the central parts E between adjacent bus bar electrodes 22 is smaller than the width of the parts F near the bus bar electrodes 22. Accordingly, the resistance of the parts of the finger electrodes 24 which are near the bus bar electrodes 22 can be reduced in the panel 100C3. It is preferable that the sectional area of the parts of the finger electrodes 24 which are near the bus bar electrodes 22 is larger than the sectional area of the parts thereof which are away from the bus bar electrodes 22. Accordingly, of the finger electrodes 24 located between the bus bar electrodes 22, the sectional area of the vicinities of the bus bar electrodes 22 larger than the sectional area around the central parts of the finger electrodes 24 can reduce the material cost without reducing the current extracting efficiency. Further, the opening area of the solar panel can be increased to generate the electric current effectively.

The panels 100C-100C3 can also be suitably produced using the above described printing apparatus 200. The printing machines of the printing section 220 have a configuration similar to that of the aforementioned printing machines, except that the ink in the ink tray 302 and the shape of the recesses formed in the intaglio printing roll 306 are different. In order to avoid redundancy, duplicated description is omitted.

The photoelectric conversion layer of the substrate 10 in each of the panels 100, 100A, 100B, 100C, 100C1, 100C2 and 100C3 contains silicon in the above description. However, it is appreciated that the present invention is not limited to the description. The photoelectric conversion layer may contain an inorganic compound material. The photoelectric conversion layer may contain InGaAS, GaAs, chalcopyrite, $Cu_2ZnSnS_4$, or CdTe—CdS. Alternatively, the photoelectric conversion layer may contain an organic compound.

Further, although the electrode 20 is provided on the silicon layer present at the surface 12 of the substrate 10 in each panel 100-100C3 in the above description, the present invention is not limited to the description. The electrodes 20 may be provided on a transparent conductive layer, which is provided on the silicon layer of the substrate 10.

Furthermore, in the above description, nothing is provided in the region of the surface 12 of the substrate 10 where the electrode 20 is not provided, except that the anti-oxidation layer 30 is provided as needed at a part of the region. However, the present invention is not limited to the above description. An anti-reflection film may be provided in the region of the surface 12 of the substrate 10 where the electrode 20 is not provided. Alternatively, an anti-reflection film may be provided over the entire surface of the substrate 10, and the electrodes 20 may be provided on the anti-reflection film.

It should be appreciated that in the case that any of the panels 100-100C3 is used as a solar panel, a plurality of any of the panels 100-100C3 are arrayed in groups.

Figure 16:
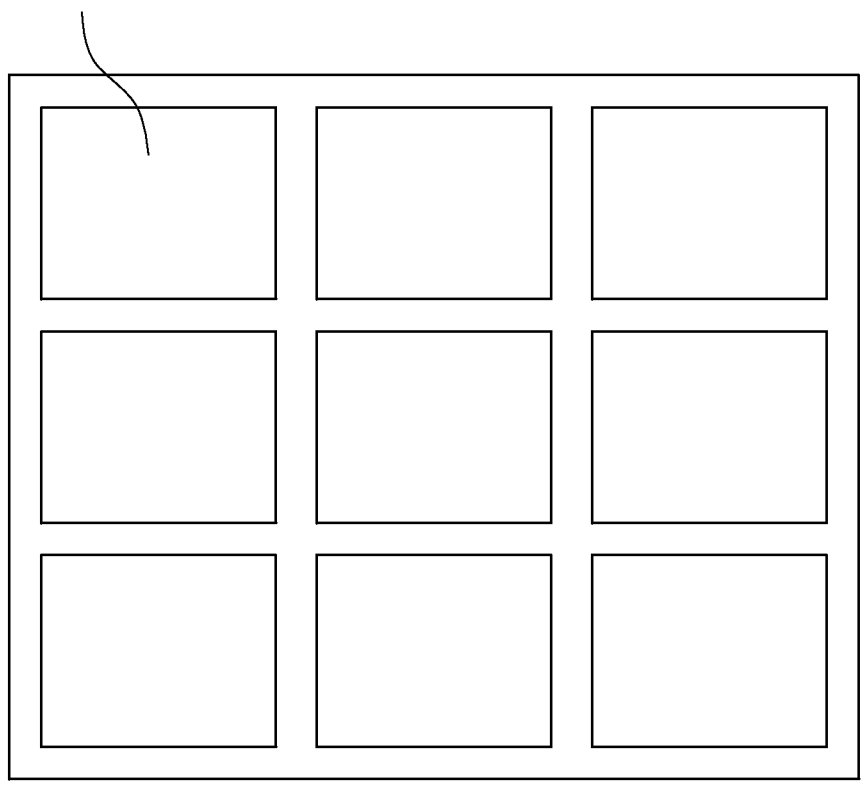
FIG. 16 is a schematic diagram of one embodiment of a solar cell module including the panels according to the present invention.

FIG. 16 shows a solar cell module 300 in which the panels 100, 100A, 100B, 100C, 100C1, 100C2 or 100C3 are arrayed. In the solar cell module 300, the panels 100-100C3 are arrayed in matrix of a plurality of rows and a plurality of columns. The panels 100-100C3 are connected together in series or in parallel.

Although the first conductive layer 20a is in contact with the surface 12 of the substrate 10 in the above description, it is appreciated that the present invention is not limited to the above description. The first conductive layer 20a may be layered on the substrate 10 with another layer interposed. In this case, it is possible that after a predetermined layer is printed on the substrate 10, the first conductive ink may be printed thereon.

Although the panels 100-100C3 are solar panels in the above description, it is appreciated that the present invention is not limited to the description. The panels 100-100C3 may be touch panels, electromagnetic wave shielding panels, etc.

Moreover, in the above description, the electrode 20 is a collector electrode. However, the present invention is not limited to the description. The electrode 20 may be part of a wire. The electrode 20 may be suitably used as a conductive layered structure.

The present invention can increase the degree of freedom of designing an electrode provided on a panel. For example, the present invention can increase the sectional area of the electrode even with a comparatively small width thereof. Further, the present invention is suitably applicable to panels for solar cells, touch panels, electromagnetic wave shielding panels, solar cell modules, etc.

What is claimed is:

1. A printing apparatus, comprising a printing section configured to print ink on a surface of a substrate, wherein
   the printing section linearly prints first conductive ink containing a first conductive material by offset printing, and linearly prints second conductive ink containing a second conductive material different from the first conductive material on the linear first conductive ink by offset printing along the linear first conductive ink, the linear second conductive ink being in contact with the linear first conductive ink,
   the printing section includes
      a first printing machine configured to print the first conductive ink, and
      a second printing machine configured to print the second conductive ink,
   the first printing machine includes
      a first transfer section configured to print the first conductive ink, and
      a first intaglio printing section having a recess and configured to attach the first conducive ink to the first transfer section, and
   the second printing machine includes
      a second transfer section configured to print the second conductive ink, and
      a second intaglio printing section having a recess and configured to attach the second conducive ink to the second transfer section.

2. The printing apparatus of claim 1, further comprising a conveyor configured to convey the substrate.

3. The printing apparatus of claim 1, wherein the printing section includes:
   a first printing machine configured to print the first conductive ink; and
   a second printing machine configured to print the second conductive ink.

4. The printing apparatus of claim 1, wherein the first conductive material contains silver.

5. The printing apparatus of claim 1, wherein the second conductive material contains any of copper, gold, carbon, cobalt, titanium, nickel, and aluminum, or at least two selected from the group consisting of silver, copper, gold, carbon, cobalt, titanium, nickel, and aluminum.

6. The printing apparatus of claim 1, wherein the printing section prints anti-oxidation ink to cover at least part of the first conductive ink and the second conductive ink.

7. The printing apparatus of claim 6, wherein the anti-oxidation ink contains a transparent material.

8. The printing apparatus of claim 6, wherein the anti-oxidation ink contains a conductive material.

9. The printing apparatus of claim 1, wherein the first conductive ink has a width larger than the second conductive ink as viewed in a normal direction of the surface of the substrate.

10. The printing apparatus of claim 1, wherein the first conductive ink has a length larger than the second conductive ink.

11. The printing apparatus of claim 1,
    wherein the first conductive ink and the second conductive ink constitute an electrode,
    the electrode has a sectional area of a section orthogonal to a longitudinal direction of the electrode, the sectional area of the electrode decreasing in the longitudinal direction of the electrode.

12. The printing apparatus of claim 11, wherein the sectional area of the electrode continuously decreases in the longitudinal direction of the electrode.

13. The printing apparatus of claim 1,
wherein the first conductive ink and the second conductive ink constitute an electrode, and
the printing apparatus further comprises an anti-oxidation ink printing machine configured to print anti-oxidation ink to cover the electrode.

14. The printing apparatus of claim 13, wherein the anti-oxidation ink printing machine prints the anti-oxidation ink having a width larger than the electrode.

15. The printing apparatus of claim 1, wherein the printing section forms a finger electrode by printing the second conductive ink.

16. A printing method for printing ink on a surface of a substrate using a printing section, comprising:
linearly printing first conductive ink containing a first conductive material by offset printing; and
linearly printing second conductive ink containing a second conductive material different from the first conductive material on the linear first conductive ink by offset printing along the linear first conductive ink so as to be in contact with the linear first conductive ink, wherein
the printing section includes
a first printing machine configured to print the first conductive ink, and
a second printing machine configured to print the second conductive ink,
the first printing machine includes
a first transfer section configured to print the first conductive ink, and
a first intaglio printing section having a recess and configured to attach the first conducive ink to the first transfer section, and
the second printing machine includes
a second transfer section configured to print the second conductive ink, and
a second intaglio printing section having a recess and configured to attach the second conducive ink to the second transfer section.

17. The printing method of claim 16, wherein
the first conductive ink and the second conductive ink constitute an electrode,
the electrode has a sectional area of a section orthogonal to a longitudinal direction of the electrode, the sectional area of the electrode decreasing in the longitudinal direction of the electrode.

18. The printing method of claim 17, wherein the sectional area of the electrode continuously decreases in the longitudinal direction of the first linear part.

19. The printing method of claim 16, wherein
the first conductive ink and the second conductive ink constitute an electrode,
the method further comprises
printing anti-oxidation ink to cover the electrode.

20. The printing method of claim 19, wherein the anti-oxidation ink has a width larger than the electrode.

21. The printing method of claim 16, wherein in the printing second conductive ink, a finger electrode is formed.

* * * * *